(12) United States Patent
Soques

(10) Patent No.: US 6,710,725 B1
(45) Date of Patent: Mar. 23, 2004

(54) ACOUSTIC NOISE SUPPRESSING CIRCUIT BY SELECTIVE ENABLEMENT OF AN INTERPOLATOR

(75) Inventor: Martin P. Soques, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/290,048

(22) Filed: Apr. 12, 1999

(51) Int. Cl.[7] .......................... H03M 7/00; H03K 5/08; H03L 5/00

(52) U.S. Cl. .......................................... 341/61; 327/310

(58) Field of Search ................... 341/143, 61; 327/270, 327/551, 310; 330/51; 348/580, 478; 710/57; 375/295; 708/316, 320, 628; 361/110; 714/743; 704/265; 381/94.1

(56) References Cited

U.S. PATENT DOCUMENTS

| | | | | |
|---|---|---|---|---|
| 4,707,742 A | * | 11/1987 | Field et al. | 348/580 |
| 5,321,700 A | * | 6/1994 | Brown et al. | 714/743 |
| 5,589,830 A | | 12/1996 | Linz et al. | 341/110 |
| 5,659,466 A | | 8/1997 | Norris et al. | 700/94 |
| 5,745,854 A | | 4/1998 | Schorman | 455/452.2 |
| 5,809,466 A | | 9/1998 | Hewitt et al. | 704/258 |

FOREIGN PATENT DOCUMENTS

EP 542715 * 1/1993

* cited by examiner

Primary Examiner—Patrick Wamsley
(74) Attorney, Agent, or Firm—Hamilton & Terrile, LLP; Stephen A. Terrile

(57) ABSTRACT

Transient signals resulting from format changes in a signal processing circuit that cause audible popping and clicking noises are simply and efficiently eliminated by disabling handling of data samples during changes between data formats. The transient signals are eliminated in a signal processor circuit that includes a buffer for storing digital data samples and a circuit for eliminating format-dependent transients in a signal processor connected to the buffer. The digital data samples are selectively formatted in a plurality of data formats. The circuit for eliminating format-dependent transients includes a sample formatter connected to the buffer that receives digital data samples from the buffer and selectively modifies the digital data samples from a first data format to a second data format of the plurality of data formats. The circuit for eliminating format-dependent transients also includes an interpolator coupled to the sample formatter and a control logic connecting the sample formatter to the interpolator for disabling transfer of digital data samples from the sample formatter to the interpolator during changes between data formats, and otherwise enabling transfer.

21 Claims, 6 Drawing Sheets

Figure 4: Initialization timing sequence of disclosure.

ACOUSTIC NOISE SUPPRESSING CIRCUIT BY SELECTIVE ENABLEMENT OF AN INTERPOLATOR

BACKGROUND OF THE INVENTION

1. Field of the Invention

The present invention relates to an audio processing integrated circuit. More particularly, the present invention relates to an audio processing integrated circuit including a noise suppressing circuit and operating method.

2. Description of the Related Art

Popping and clicking sounds are unwanted, noisy, audible sounds produced by audio circuits that are connected to sound generating sources such as speakers and headphones. Application of power to an integrated circuit connected to a sound generating source for driving audio signals is one condition that produces pops and clicks. The noise results from a large increase in voltage at the output terminals of the integrated circuit from near zero volts before power is applied to a nominal voltage when the integrated circuit is powered.

Another condition that produces pops and clicks is playback of signal samples encoded in a format different from the default format of the integrated circuit. For example, an integrated circuit using a 16-bit signed format as the default format generates clicks when samples in a different format are received. The pops and clicks result because, when the playback path is initialized or deactivated, a sample formatting block in the integrated circuit is initialized to the default state that is set to receive 16-bit signed format samples.

A typical integrated circuit includes a first-in-first-out (FIFO) buffer that feeds data to the sample formatting block. In the default condition, the FIFO output latches are reset to zero so that zero samples are transferred to the sample formatting block. In the default condition, when the play path of the integrated circuit is enabled, the sample formatting block reads zeroes from the FIFO and generates zeroes that maintain the analog output signal at mid-scale. Consequently, the audio output signal is silent and no audible popping or clicking results.

In some circumstances, a programmer may select an alternative data format other than the default 16-bit signed format. For example, a programmer may select processing of 8-bit samples. Since the default condition of the FIFO output latches and sample formatting block are initialized to zero, the sample formatting block translates the 8-bit zeroes to a non-zero signed value based on the programmed 8-bit format (unsigned, μ-law, or A-law). Table I illustrates the correspondence between 8-bit zeroes and 16-bit values:

TABLE I

| 8-bit format | formatting block 16-bit signed output from zeroes | |
|---|---|---|
| | hexadecimal | decimal |
| simple unsigned (16-bit trunc) | 8000H | −32768 |
| μ-Law | 8284H | −32124 |
| A-Law | EA80H | −5504 |

A result of the formatting discrepancy after 8-bit playback enable is the generation of a transient in the analog output signal. The transient is expressed acoustically as an audible pop or click. An example of a transient is shown in FIG. 1, a graph which illustrates an analog trace resulting from the playing of 8-bit zeroes. In the example, the sample formatting block is programmed for the 8-bit unsigned format. After play is enabled, the FIFO is written and filled with hexadecimal 80H values which are equivalent to an analog midscale value, in one example, $V_{REF}$=2.0 volts. As shown in FIG. 1, the analog output signal forms a spike to the negative full-scale value as the initial data zeroes in the FIFO are read. Once the hexadecimal 80H values from the FIFO are read, the analog output signal returns to the midscale value.

One solution to the problem of transients resulting from data format changes is achieved by initializing the FIFO to correct values based on the programmed 8-bit format. Such initialization requires additional complex circuit in the FIFO so that the FIFO presents the proper 8-bit midscale value after initialization. Unfortunately the complex FIFO circuit consumes a larger integrated circuit area than is desired.

What is needed is a simple circuit and operating technique that eliminate format-dependent signal transients and resultant pops and clicks.

SUMMARY OF THE INVENTION

Transient signals resulting from format changes in a signal processing circuit that cause audible popping and clicking noises are simply and efficiently eliminated by disabling handling of data samples during changes between data formats.

The transient signals are eliminated in a signal processor circuit that includes a buffer for storing digital data samples and a circuit for eliminating format-dependent transients in a signal processor connected to the buffer. The digital data samples are selectively formatted in a plurality of data formats. The circuit for eliminating format-dependent transients includes a sample formatter connected to the buffer that receives digital data samples from the buffer and selectively modifies the digital data samples from a first data format to a second data format of the plurality of data formats. The circuit for eliminating format-dependent transients also includes an interpolator coupled to the sample formatter and a control logic connecting the sample formatter to the interpolator for disabling transfer of digital data samples from the sample formatter to the interpolator during changes between data formats, and otherwise enabling transfer.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
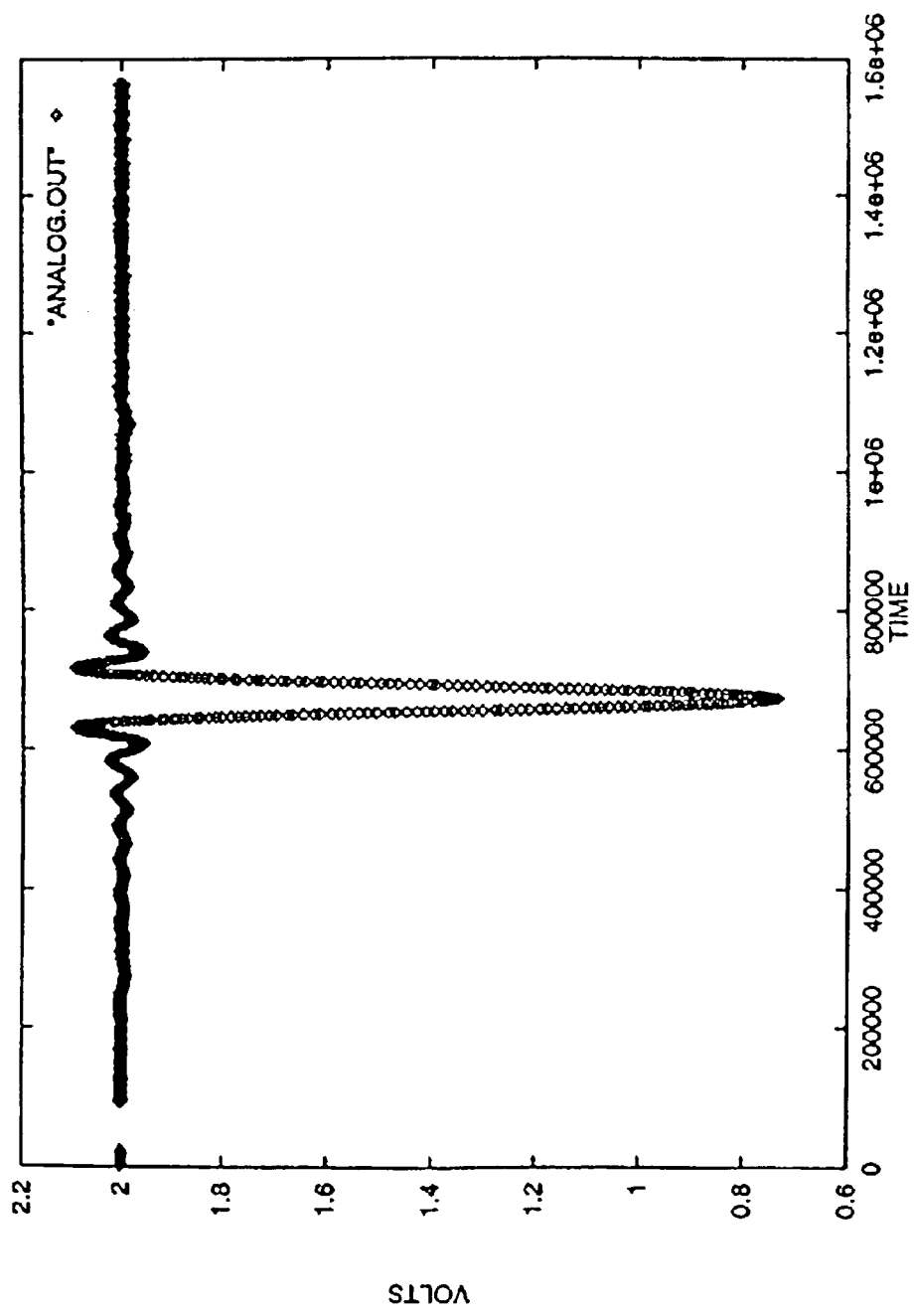
FIG. 1 is a graph illustrating an analog trace of a transient signal resulting from the playing of 8-bit zeroes.
Figure 2:
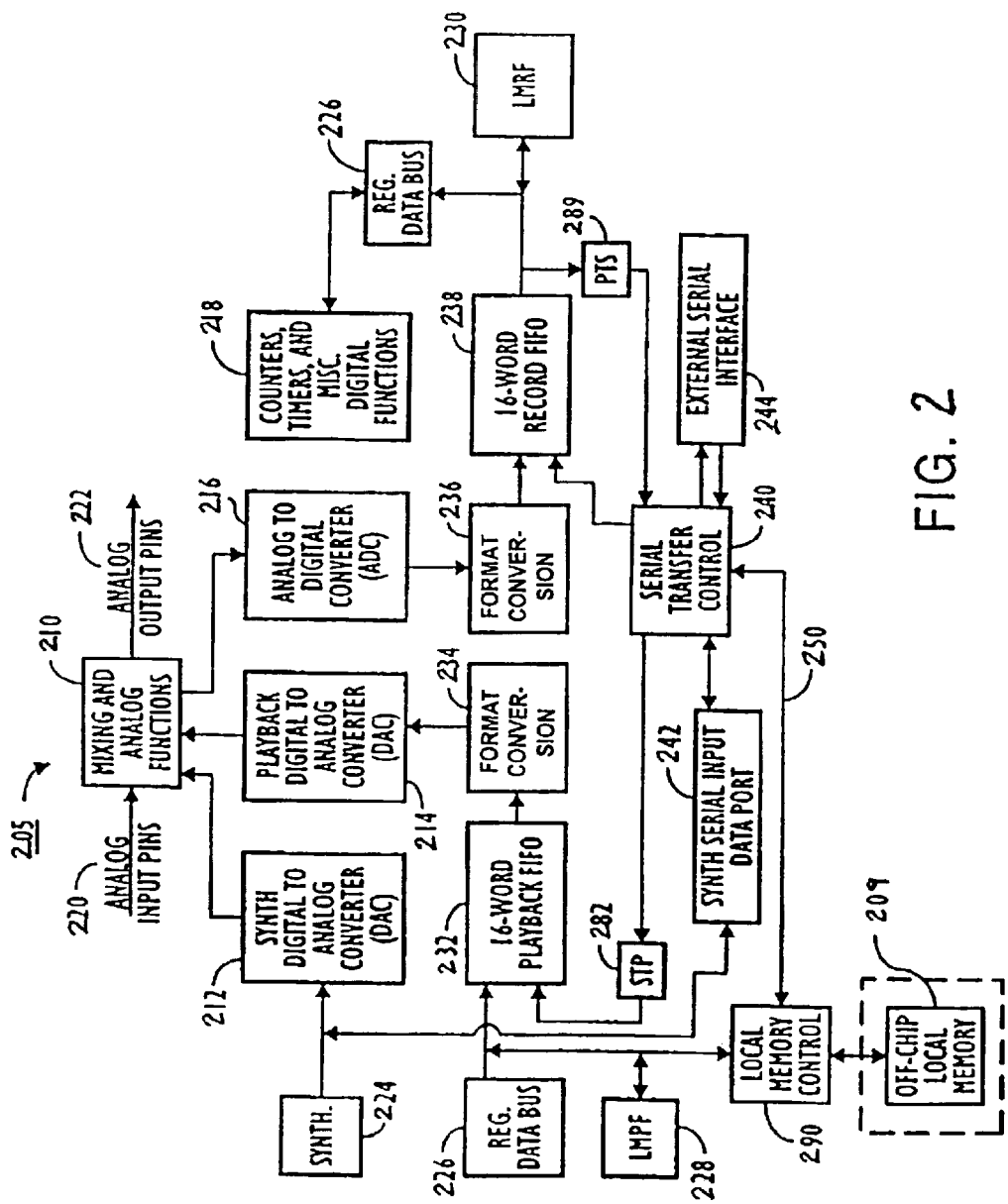
FIG. 2 is a schematic block diagram showing functional blocks of an audio signal processor, or Coder-Decoder (CODEC), that is suitable for implementing a circuit for eliminating format-dependent transients and resultant undesirable pop and click sounds.

FIG. 2 depicts, in block diagram format, the features and functions included within a CODEC module device 205. The CODEC device 205, includes on-chip memory which is configured in one example as 16-sample, 32-bit wide, record and playback FIFOs 238, 232. The CODEC device 205 implements data comparison operations with selectable thresholds for generating DMA and I/O interrupts for data read and write operations. A Mixing and Analog Functions block 210 implements functions including left and right channel analog mixing, multiplexing and loopback functions. Left channel and right channel stereo, and single channel mono, analog audio signals are summed in Mixing and Analog Functions block 210. The mono and stereo audio signals are generated from the CODEC 205 for external use on analog output pins 222. Input signals to the Mixing and Analog Functions block 210 are supplied from external Analog Input Pins 220, analog output from a Synthesizer Digital-to-Analog Converter block 212, which is external to CODEC 205 or may be a processing block within CODEC 205, and from the Playback Digital-to-Analog Converter block 214. Analog audio output signals from Mixing Analog Functions block 210 are supplied to record Analog-to-Digital Converter 216 block. Synthesizer Digital-to-Analog Converter block 212 receives Digital data from a synthesizer 224. Typically the synthesizer 224 is an external device or is integrated onto the same monolithic integrated circuit as the CODEC device 205.

A record path for the CODEC 205 has analog audio data generated from Mixing and Analog Functions block 210 and supplied to record Analog-to-Digital Converter (ADC) 216 block to be converted to 16-bit signed data. The sample rate for record ADC 216 is selected to determine the sound quality. A higher sample rate for record ADC 216 results in a better recorded digital audio signal which approaches the original audio signal in quality. One suitable example of the record ADC 216 includes a fourth order cascaded delta-sigma modulator that has a functionality and operation described in U.S. Pat. No. 5,745,854, entitled "Method and Apparatus for Dynamically Adjusting a Maximum Number of Users on a Channel Utilizing a Voice Activating Factor", assigned to the common assignee of the present invention. The converted digital audio data is sent to format conversion block 236 which converts the 16-bit digital audio data to a preselected data format. The formatted digital data is transferred to 32-bit wide record FIFO 238 as 16-bit left and 16-bit right channel data for further submission to a register data bus 226 for output to external system memory (not shown) or to an off-chip local memory record FIFO 230 (LMRF).

The playback path for CODEC 205 includes digital data in a preselected data format that is sent to the 32-bit wide playback FIFO 232 from the off-chip local memory playback FIFO (LMPF) 228 or from external system memory (not shown), via the register data bus 226. Typically the LMRF 230 and LMPF 228 are implemented as discrete off-chip FIFOs or a dedicated address space within off-chip local memory 209 configured as FIFOs. The formatted data is applied to a format conversion clock 234 and converted to 16-bit signed data. The data is sent to the CODEC playback DAC 214 and converted to an analog audio signal and output to the input of Mixing and Analog functions block 210.

A Serial Transfer Control block 240 supplies serial-to-parallel and parallel-to-serial conversion functions and a loop back functionality between the output terminal of 32-bit wide record FIFO 238 and the input terminal of 32-bit wide playback FIFO 232. A synthesizer serial input data port 242 receives serial data from synthesizer 224 and communicates with serial Transfer Control block 240. Serial Transfer Control block 240 is connected to record FIFO 238, playback FIFO 232, off-chip local memory 209 (or, LMRF 230 and LMPF 228) via a local memory control 290, synthesizer serial input data port 242, and to an External Serial Interface. Bi-directional serial data communication over External Serial Interface 244, which includes an external serial port, is provided to Serial Transfer Control block 240. External serial interface 244 may be a UART, or other device that provides either synchronous or asynchronous controlled serial data transfers. External Serial Interface 244 is connected for serial communication with an external digital signal processor (DSP) for off-chip generation of special audio effects, or with another suitable device capable of bi-directional serial data communication. External serial interface 244 also supplies a serial data path from external synthesizer serial input port 242. A data path 250 transfers data bi-directionally between the serial transfer control 240 and the local memory control 290.

The CODEC 205 includes A/D conversion functions in the record path and D/A conversion functions in the playback path. The conversion functions operate either independently or in cooperation at the different or common sampling rates so that A/D and D/A operations may be performed simultaneously, each having a different sample rate and data format. Loop access circuitry in a mixing block 206 supports sampling of an audio signal and analog-to-digital conversion at one rate, digitizing of the signal, and playback of the digitized sample back through the playback D/A at a different sample rate.

The block designated Counters, Timers and Miscellaneous digital functions 218 includes circuitry which controls A/D and D/A conversions in CODEC 205, format conversion blocks 232, 236, and data transfer functions. CODEC 205 operation supports data formats including 8-bit unsigned linear; 8-bit µ-law; 8-bit A-law; 16-bit signed little endian; 16-bit signed big endian; or 4-bit 4:1 IMA ADPCM format.

Figure 3:
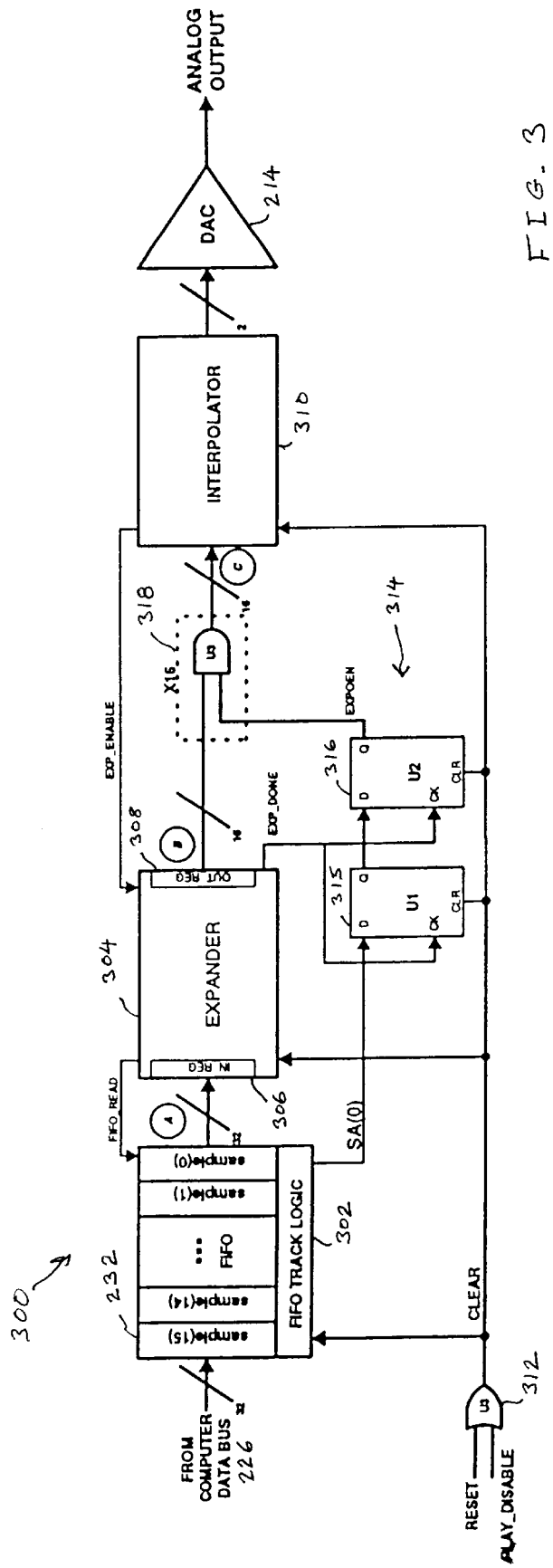
FIG. 3 is a schematic block diagram that illustrates a suitable circuit for eliminating format-dependent transients in an audio signal processor such as the CODEC shown in FIG. 2.

Referring to FIG. 3, a schematic block diagram illustrates a suitable audio signal processing circuit 300 for eliminating format-dependent transients in an audio signal processor such as the CODEC device 205. The audio signal processing circuit 300 receives data from the register data bus 226 and stores the received data in a playback FIFO 232. In the illustrative audio signal processing circuit 300, the playback FIFO 232 stores sixteen 32-bit wide words. In addition to the sixteen storage cells, the playback FIFO 232 includes a FIFO tracking logic 302.

The playback FIFO 232 supplies data to an expander 304, or sample formatting block, that selectively expands the number of bits in data elements received from the playback FIFO 232. The expander 304 receives data from the playback FIFO 232 into an input holding register 306. The expander 304 converts 8-bit unsigned values to a 16-bit signed equivalent and temporarily stores in the expanded data values in an output register 308.

Output data from the expander 304 are transferred from the output register 308 as an expander output signal EXP_OUT at node B to an interpolator 310. The interpolator 310 interpolates digital data samples, supplying interpolated samples to the Playback Digital-to-Analog Converter block 214.

Operation of the audio signal processing circuit 300 is controlled by reset (RESET) and play disable (PLAY_DISABLE) signals, which are typically supplied by a processor or other control block (not shown). The RESET and PLAY_DISABLE signals are ORed using an OR-gate 312 to produce a clear (CLEAR) signal that is connected to the playback FIFO 232, the expander 304, and the interpolator 310 to initialize the respective functional blocks.

Reading of the playback FIFO 232 is controlled by a FIFO read signal (FIFO READ) from the expander 304 that designates when the input holding register 306 is prepared to receive sample data. The FIFO tracking logic 302 of the playback FIFO 232 generates a sample available signal SA(0) when sample data reaches the bottom of the sixteen word buffers of the playback FIFO 232. The sample available signal SA(0) is applied to a two-bit shift register 314 including a first stage 315 (U1_Q) and a second stage 316 (U2_Q). The two-bit shift register 314 is cleared by an expander done signal (EXP_DONE) from the expander 304. The EXP_DONE signal is generated when a sample is expanded. The two-bit shift register 314 is cleared by the CLEAR signal. The two-bit shift register 314 generates an expander output enable signal (EXPO_EN) that is applied to a 16 element bank of AND-gates 318. In the illustrative circuit, the two stages 315 and 316 of the two-bit shift register 314 are D flip-flops with the D terminal of the first stage 315 (U1_Q) receiving the sample available signal SA(0), and the second stage 316 (U2_Q) receiving an output signal from the Q terminal of the first stage 315 (U1_Q) flip-flop. The two stages of the two-bit shift register 314 are clocked by the expander done signal (EXP_DONE) and cleared by the CLEAR signal.

A first of the two input terminals of the individual AND-gates are connected to one of the 16 bits from the sample formatting block. The second input terminal receives the expander output enable signal (EXPO_EN). One of the AND-gates 318 is allocated to each of the output bits of the expander 304. The EXPO_EN signal forces low the input signal to the interpolator 310 (INT_IN) at node C.

The interpolator 310 generates an expander enable signal (EXP_ENABLE) that is passed back to the expander 304 to control the data expanding operation of the expander 304.

Figure 4:
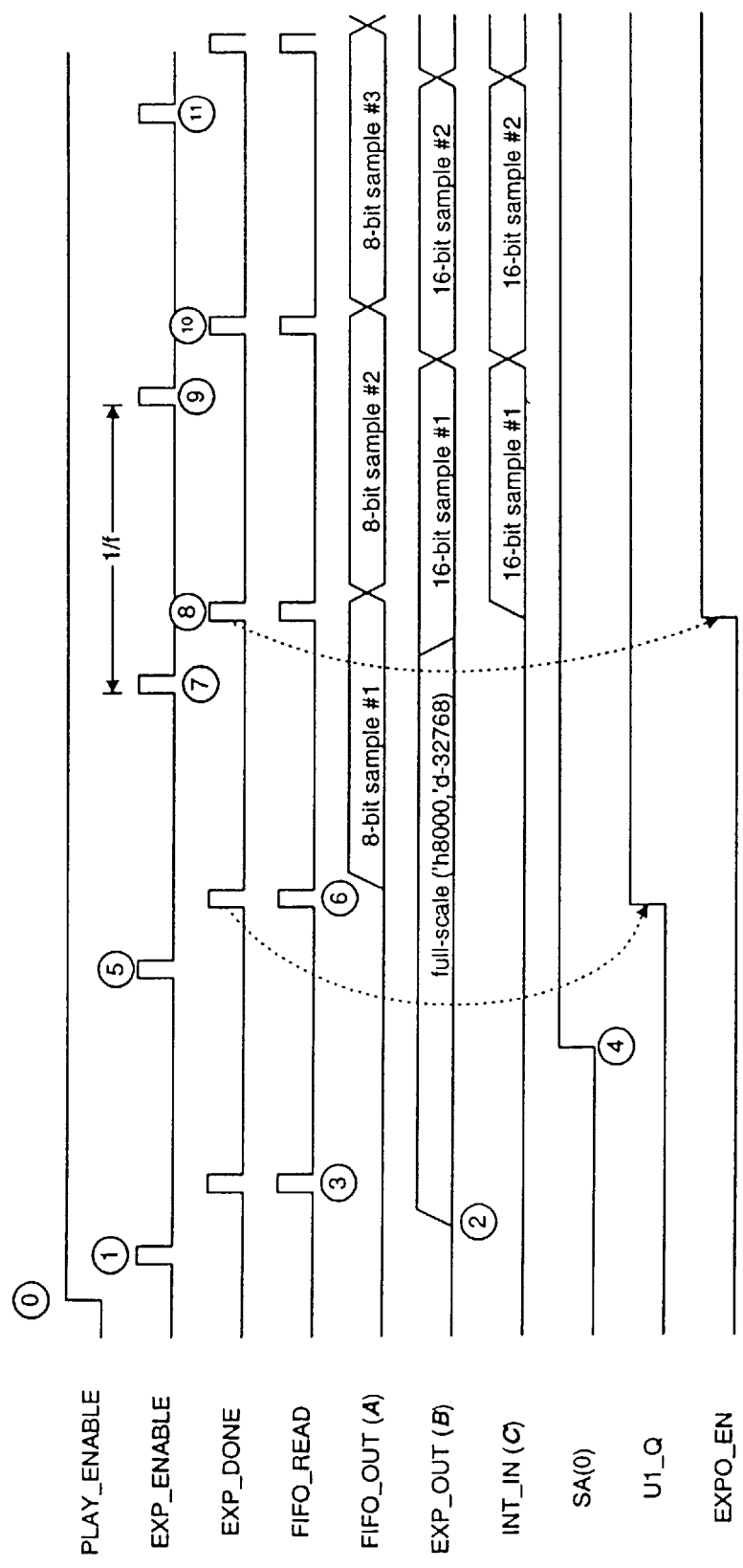
FIG. 4 is a schematic timing diagram illustrating an initialization operation of the audio signal processing circuit.

Referring to FIG. 4, a schematic timing diagram illustrates an initialization operation in the playback pathway of the audio signal processing circuit 300. The playback pathway is initially reset and initialized. At time t0, the playback pathway is enabled as a playback enable signal (PLAY_ENABLE) is stepped from a low state to a high state. The PLAY_ENABLE signal is the inverse or complement of the PLAY_DISABLE signal that is received by the OR-gate 312 shown in FIG. 3. Before the PLAY_ENABLE signal is asserted, the exponent output enable signal EXPO_EN forces low the input signal INT_IN to the interpolator 310 at node C until a valid sample has been processed.

At a time t1, the interpolator 310 begins reading samples of the input signal INT_IN from node C at the sampling frequency of fMHz. Since the expander output enable signal EXPO_EN is low, the interpolator 310 reads the mid-scale value (zeroes). The interpolator 310 generates the expander enable signal EXP_ENABLE that indicates when the interpolator 310 is reading samples and applies the EXP_ENABLE signal to the expander 304.

At a time t2, the expander enable signal EXP_ENABLE generated at the time t1 causes the expander 304 to expand the sample contained in the input holding register 306. Since the playback pathway was previously in a reset condition, the input holding register 306 contains only data zeroes. The expander 304 converts the data zeroes from an 8-bit unsigned format to an equivalent 16-bit signed format value, specifically negative full-scale (−32,768).

At a time t3, the expander 304 signals completion of the sample expanding operation by asserted an expand operation done signal EXP_DONE. The expander 304 reads a sample from the playback FIFO 232 simultaneously with assertion of the EXP_DONE signal. Also for the second sample, the playback FIFO 232 was reset to contain zero values and has not yet received a valid 8-bit sample so that the expander 304 again reads a zero value into the input holding register 306.

At a time t4, the first valid 8-bit sample is written to the playback FIFO 232 and steps to the bottom of the 16-level FIFO stack. When the first valid sample reaches the bottom of the FIFO stack, the FIFO tracking logic 302 asserts a SA(0) signal that designates that the bottom sample in the playback FIFO 232 is available. Assertion of the SA(0) signal signifies the earliest time at which an external processor (not shown) can supply a first valid 8-bit sample.

At a time t5, the interpolator 310 reads a second 16-bit sample, following reading of the first sample by a time 1/f. As the interpolator 310 reads the second sample, the expander 304 translates the 8-bit value designating the zero value read at time t3 to an equivalent value in the 16-bit signed format. The expander output signal EXP_OUT at node B maintains a negative full-scale value (−32,768). Since the expander output enable signal EXPO_OUT is low, the interpolator 310 reads a midscale value (all zeroes). Usage of expander output enable logic, such as the two-bit shift register 314 and the 16 element bank of AND-gates 318, produces the condition in which the interpolator reads the midscale value rather than reading a negative full-scale value and thereby initiating a noise spike or transient.

At a time t6, the expander 304 asserts the expander done signal (EXP_DONE) and reads a sample from the playback FIFO 232. Also at the time t6, the first valid 8-bit sample is loaded into the input holding register 306 of the expander 304. Also at the same time t6, the sample available signal SA(0) propagates to the first stage 315 (U1_Q) of the two-bit shift register 314.

At a time t7, the interpolator 310 reads a third 16-bit sample, following reading of the second sample by a time 1/f. As the interpolator 310 reads the third sample, the expander 304 translates the 8-bit value designating the first valid 8-bit sample value read at time t6 to an equivalent value in the 16-bit signed format. The expander output signal EXP_OUT at node B maintains a negative full-scale value (−32,768) until the translation is complete. Since the expander output enable signal EXPO_OUT is low, the interpolator 310 reads a midscale value (all zeroes). Usage of expander output enable logic, such as the two-bit shift register 314 and the 16 element bank of AND-gates 318, produces the condition in which the interpolator reads the midscale value rather than reading a negative full-scale value and thereby initiating a noise spike or transient.

At a time t8, the expander 304 asserts the expander done signal (EXP_DONE) indicating that translation of the first valid 8-bit sample is complete. At the same time t8, the sample available signal SA(0) propagates to the second stage 316 (U2_Q) of the two-bit shift register 314, enabling the expander output signal EXP_OUT at node B to be applied to the interpolator 310 (INT_IN) at node C. The expander output signal EXP_OUT value is equal to the first valid 16-bit signed value. Also at the time t8, the expander 304 reads a second sample from the playback FIFO 232.

At a time t9, the interpolator 310 reads a fourth 16-bit sample, following reading of the third sample by a time 1/f. Since the expander output enable signal EXPO_OUT is high, the interpolator 310 reads the first valid translated sample from the expander 304. Also at the time t9, the expander 304 translates the second 8-bit data format value that was read from the playback FIFO 232 at time t8.

At a time t10, the expander 304 has completed the expansion operation of the second valid sample and reads a third valid sample.

At a time t11, the interpolator 310 reads the valid translated sample from the expander 304.

Figure 5:
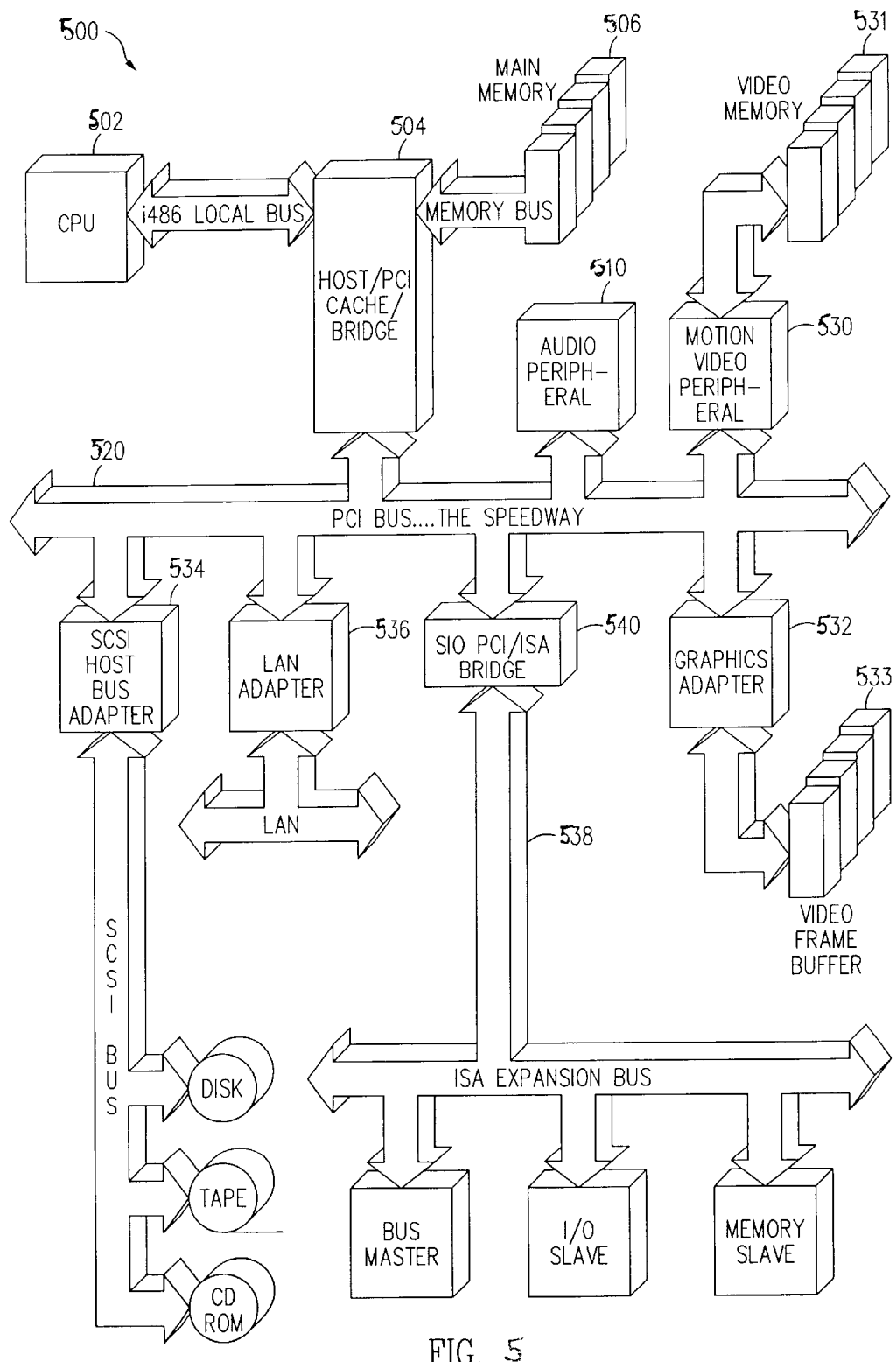
FIG. 5 is a schematic block diagram illustrating a computer system incorporating an audio signal processor, or Coder-Decoder (CODEC), according to FIG. 2.

FIG. 5 illustrates an audio performance computer system 500 including an audio wavetable synthesizer integrated circuit 510. The computer system 500 employs an architecture based on a bus, such as an Intel™ PCI bus interface 520, and includes a central processing unit (CPU) 502 connected to the PCI bus interface 520 through a Host/PCI/Cache interface 504. The CPU 502 is connected to a main system memory 506 through the Host/PCI/Cache interface 504. A plurality of various special-purpose circuits may be connected to the PCI bus interface 520 such as, for example, the audio wavetable synthesizer integrated circuit 510, a motion video circuit 530 connected to a video memory 531, a graphics adapter 532 connected to a video frame buffer 533, a small systems computer interface (SCSI) adapter 534, a local area network (LAN) adapter 536, and perhaps a expansion bus such as an ISA expansion bus 538 which is connected to the PCI bus interface 520 through an SIO PCI/ISA bridge 540.

The audio wavetable synthesizer integrated circuit 510 accesses musical voice data in several different voices and processes the multiple voice data into a single set of audio signals, such as stereo audio signals, although other audio formats such as three-output, five-output, theater-in-the-home formats and other audio formats are also possible. A voice data signal is a single defined sound such as a note of one instrument, a digital audio file, or a digital speech file.

The audio wavetable synthesizer integrated circuit 510 advantageously supplies high-quality, low-cost audio functions in a personal computer environment. The audio wavetable synthesizer integrated circuit 510 supports logic functions and digital signal processing for performing audio functions typically found in personal computer systems. The audio wavetable synthesizer integrated circuit 510 incorporates a polyphonic music synthesizer and a stereo CODEC device 205. The audio wavetable synthesizer integrated circuit 510 generates audio signals based on data that is received from the main system memory 506, rather than through a local memory interface. Accordingly, performance of the audio wavetable synthesizer integrated circuit 510 is highly dependent on the bus communication structures of the computer system 500. In one embodiment, the audio wavetable synthesizer integrated circuit 510 addresses up to 64 Mbytes of system memory 506 and generates an audio signal including up to 32 simultaneous voices.

Various embodiments of the computer system 500 use operating systems such as MS-DOS™, Windows™, Windows 95™, Windows N™ and the like.

Figure 6:
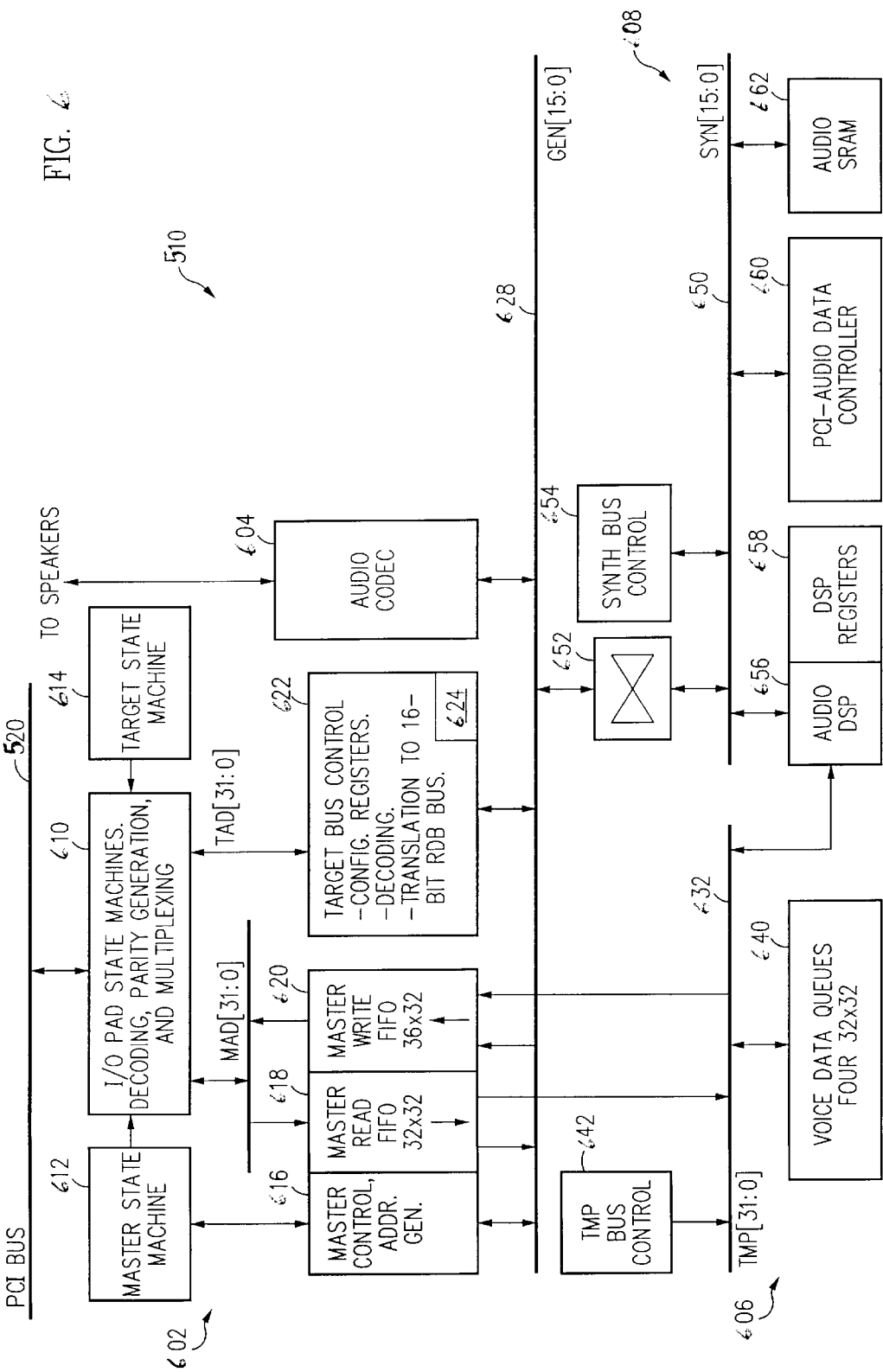
FIG. 6 is a schematic block diagram illustrating an embodiment of the audio wavetable synthesizer integrated circuit for performing logic and digital signal processing supporting audio functions and including a vertical wavetable cache that is suitable for usage in the computer system shown in FIG. 5.

Referring to FIG. 6, a schematic block diagram illustrates an embodiment f the audio wavetable synthesizer integrated circuit 510 performs logic and digital signal processing supporting audio functions implemented in a personal computer. The audio wavetable synthesizer 510 is connected to a PCI bus interface 520 and includes a PCI bus interface unit 602, an audio codec 604, an audio cache 606, and an audio synthesizer 608.

The PCI bus interface unit 602 is connected between the PCI bus 520 and two buses internal to the audio wavetable synthesizer 510, specifically a general (GEN) bus 628 and a temporary (TMP) bus 632. The TMP bus 632 is internal to the audio cache 606. The audio cache 606 includes the TMP bus 632, a TMP bus control circuit 642 and a voice data queue 640. The TMP bus control circuit 642 and the voice data queue 640 are connected to the TMP bus 632.

The audio synthesizer 608 is connected to the GEN bus 628 and communicates via the PCI bus 520 through the PCI bus interface unit 602. The audio synthesizer 608 includes a 16-bit synthesizer bus 650 which is connected to the GEN bus 628 by a synthesizer bus interface 652. The audio synthesizer 608 includes a synthesizer bus controller 654, an audio digital signal processor (DSP) 656, a plurality of digital signal processor (DSP) registers 658, a PCI-Audio data controller 660, and an audio static random access memory (SRAM) 662. The audio DSP 656 is connected to the synthesizer bus 650 and connected to the TMP bus 632 of the audio cache 606. The synthesizer bus controller 654, the PCI-Audio data controller 660, and the audio SRAM 662 are connected to the synthesizer bus 650. The DSP registers 658 are connected to the audio DSP 656.

While the invention has been described with reference to various embodiments, it will be understood that these embodiments are illustrative and that the scope of the invention is not limited to them. Many variations, modifications, additions and improvements of the embodiments described are possible. For example, those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

For example, although the described logic circuit that enables and disables transfer of data from the expander 304 to the interpolator 310 includes the two-bit shift register 314 and the 16 element bank of AND-gates 318, other alternative circuits may be employed that perform the same operations and functionality. These alternative circuits would be readily apparent to one skilled in the art, once instructed by the present disclosure.

What is claimed is:

1. A signal processor circuit comprising:
   a buffer for storing digital data samples, the digital data samples being selectively formatted in a plurality of data formats; and
   a circuit for eliminating format-dependent transients in a signal processor coupled to the buffer including:
   a sample formatter coupled to the buffer for receiving digital data samples from the buffer and selectively modifying digital data samples from a first data format to a second data format of the plurality of data formats;

an interpolator coupled to the sample formatter; and
a control logic coupling the sample formatter to the interpolator for disabling transfer of digital data samples from the sample formatter to the interpolator during changes between data formats, and otherwise enabling transfer.

2. A signal processor circuit according to claim 1 wherein the control logic includes:
a shift register coupled to receive a driving signal from the buffer and coupled to receive a formatting done signal from the sample formatter, the shift register generating a control signal; and
a gate circuit coupled to transfer the digital data samples from the sample formatter to the interpolator, the gate circuit being enabled and disabled by the control signal.

3. A signal processor circuit according to claim 1 wherein:
the sample formatter converts formatting of digital data samples between 8-bit samples and 16-bit samples.

4. A signal processor circuit according to claim 1 wherein:
the sample formatter converts formatting of digital data samples between 8-bit samples and 16-bit samples, the 8-bit samples being selected from among an unsigned format, a $\mu$-law format, and an A-law format.

5. A signal processor circuit according to claim 1 wherein:
the buffer is coupled to a data bus, the data bus supplying digital data samples to the buffer.

6. A signal processor circuit according to claim 1 wherein:
the buffer and the circuit for eliminating format-dependent transients in an audio signal processor form an acoustic playback pathway.

7. An audio signal processor circuit comprising:
a first-in-first-out (FIFO) buffer that stores digital data samples, the digital data samples being selectively formatted in a plurality of data formats;
a digital-to-analog converter (DAC) coupled to the FIFO buffer that converts the digital data samples into analog signals; and
a circuit that eliminates format-dependent transients in an audio signal processor coupling the FIFO buffer to the DAC including:
a sample formatting block coupled to the FIFO buffer that receives digital data samples from the FIFO buffer and selectively modifies digital data samples from a first data format to a second data format of the plurality of data formats;
an interpolator coupled to the sample formatting block; and
an enable/disable logic coupling the sample formatting block to the interpolator that disables transfer of digital data samples from the sample formatting block to the interpolator during changes between data formats, and otherwise enables transfer.

8. An audio signal processor circuit according to claim 7 wherein the enable/disable logic includes:
a shift register driven by a sample available signal from the FIFO buffer, clocked by a formatting done signal from the sample formatting block, and generating an enable/disable signal; and
a multiple-element bank of gates coupled to transfer the digital data samples from the sample formatting block to the interpolator, the gates being enabled and disabled by the enable/disable signal.

9. An audio signal processor circuit according to claim 7 wherein:
the sample formatting block converts formatting of digital data samples between 8-bit samples and 16-bit samples.

10. An audio signal processor circuit according to claim 7 wherein:
the sample formatting block converts formatting of digital data samples between 8-bit samples and 16-bit samples, the 8-bit samples being selected from among an unsigned format, a $\mu$-law format, and an A-law format.

11. An audio signal processor circuit according to claim 7 wherein:
the FIFO buffer is coupled to a data bus, the data bus supplying digital data samples to the FIFO buffer.

12. An audio signal processor circuit according to claim 7 wherein:
the FIFO buffer, the DAC, and the circuit that eliminates format-dependent transients in an audio signal processor form an acoustic playback pathway.

13. A coder-decoder (CODEC) comprising:
a receive pathway circuit including an analog-to-digital converter (ADC), a receive format converter coupled to the ADC, and a receive buffer coupled to the receive format converter;
a playback pathway circuit including:
a playback buffer for storing digital data samples, the digital data samples being selectively formatted in a plurality of data formats; and
a circuit for eliminating format-dependent transients in a signal processor coupled to the playback buffer including:
a sample formatter for receiving digital data samples from the playback buffer and selectively modifying digital data samples from a first data format to a second data format of the plurality of data formats;
an interpolator coupled to the sample formatter; and
a control logic coupling the sample formatter to the interpolator for disabling transfer of digital data samples from the sample formatter to the interpolator during changes between data formats, and otherwise enabling transfer; and
a mixer coupled to the receive pathway circuit and the playback pathway circuit.

14. A CODEC according to claim 13 wherein the control logic includes:
a shift register coupled to receive a driving signal from the playback buffer and coupled to receive a formatting done signal from the sample formatter, the shift register generating a control signal; and
a gate circuit coupled to transfer the digital data samples from the sample formatter to the interpolator, the gate circuit being enables and disabled by the control signal.

15. A computer system comprising:
a processor;
a memory coupled to the processor;
a bus coupled to the processor; and
a coder-decoder (CODEC) comprising:
a receive pathway circuit including an analog-to-digital converter (ADC), a receive format converter coupled to the ADC, and a receive buffer coupled to the receive format converter;
a playback pathway circuit including:
a playback buffer for storing digital data samples, the digital data samples being selectively formatted in a plurality of data formats; and
a circuit for eliminating format-dependent transients in a signal processor coupled to the playback buffer including:

a sample formatter coupled to the playback buffer for receiving digital data samples from the playback buffer and selectively modifying digital data samples from a first data format to a second data format of the plurality of data formats;

an interpolator coupled to the sample formatter; and a control logic coupling the sample formatter to the interpolator for disabling transfer of digital data samples from the sample formatter to the interpolator during changes between data formats, and otherwise enabling transfer; and a mixer coupled to the receive pathway circuit and the playback pathway circuit.

16. A computer system according to claim 15 wherein the control logic includes:

a shift register coupled to receive a driving signal from the playback buffer and coupled to receive a formatting done signal from the sample formatter, the shift register generating a control signal; and a gate circuit coupled to transfer the digital data samples from the sample formatter to the interpolator, the date circuit being enabled and disabled by the control signal.

17. A method of eliminating format-dependent transients in a signal processor comprising:

accessing digital data samples that are selectively formatted in a plurality of data formats;

selectively modifying the format of digital data samples from a first data format to a second data format of the plurality of data formats;

interpolating the accessed digital data samples; and disabling interpolation of the digital data samples during changes between data formats, and otherwise enabling interpolation.

18. A method according to claim 17, further comprising:

storing a plurality of the accessed digital data samples; and determining when a sample is available from the stored digital data samples.

19. A method according to claim 18, further comprising:

determining when the selective modification of the digital data samples is complete; and determining whether the interpolation is to be enabled or disabled by delaying interpolation until the available sample by a delay time clocked by completion of the selective modification of the digital data samples.

20. A signal processor circuit comprising:

a buffer for storing digital data samples, the digital data samples being selectively formatted in a plurality of data formats; and means for eliminating format-dependent transients in a signal processor coupled to the buffer including:

means coupled to the buffer for receiving digital data samples from the buffer and selectively modifying digital data samples from a first data format to a second data format of the plurality of data formats;

means coupled to the modifying means for interpolating samples; and means coupling the sample formatter to the interpolator for disabling transfer of digital data samples from the sample formatter to the interpolator during changes between data formats, and otherwise enabling transfer.

21. A signal processor circuit according to claim 20 wherein the means for disabling and enabling transfer includes:

means coupled to receive a driving signal from the buffer and coupled to receive a formatting done signal from the sample formatter for generating a control signal; and a gate circuit coupled to transfer the digital data samples from the modifying means to the interpolating means, the gate circuit being enabled and disabled by the control signal.

* * * * *